United States Patent
Saloka et al.

(10) Patent No.: US 6,540,850 B2
(45) Date of Patent: Apr. 1, 2003

(54) MEMBRANE AND A METHOD FOR MAKING A MEMBRANE

(75) Inventors: George Steve Saloka, Dearborn, MI (US); Shazad Mahmood Butt, Troy, MI (US)

(73) Assignee: Ford Motor Company, Dearborn, MI (US)

(*) Notice: Subject to any disclaimer, the term of this patent is extended or adjusted under 35 U.S.C. 154(b) by 0 days.

(21) Appl. No.: 09/848,399

(22) Filed: May 3, 2001

(65) Prior Publication Data

US 2002/0164496 A1 Nov. 7, 2002

(51) Int. Cl.$^7$ .................. B32B 15/20; C21D 9/00; B01D 71/02
(52) U.S. Cl. ................ 148/536; 148/527; 148/537
(58) Field of Search ............... 428/613, 607, 428/608, 606, 670; 96/11; 95/56; 228/235.2, 235.3; 148/537, 536, 527, 518; 427/383.7

(56) References Cited

U.S. PATENT DOCUMENTS

| | | | | |
|---|---|---|---|---|
| 4,496,373 A | * | 1/1985 | Behr et al. ................. | 205/354 |
| 4,699,637 A | * | 10/1987 | Iniotakis et al. ............ | 376/314 |
| 5,518,530 A | * | 5/1996 | Sakai et al. ................. | 55/524 |
| 5,768,019 A | * | 6/1998 | Niwa et al. ................. | 349/113 |
| 6,183,542 B1 | * | 2/2001 | Bossard ...................... | 55/524 |
| 6,238,465 B1 | * | 5/2001 | Juda et al. .................. | 427/437 |
| 6,315,820 B1 | * | 11/2001 | Saloka et al. ............... | 427/383.7 |

FOREIGN PATENT DOCUMENTS

| | | | |
|---|---|---|---|
| DE | 19905638 C1 | * | 6/2000 |
| JP | 07-193006 | * | 7/1995 |
| JP | 63-295402 | * | 12/1998 |

* cited by examiner

*Primary Examiner*—John J. Zimmerman
(74) *Attorney, Agent, or Firm*—Chupa & Alberti, P.C.

(57) ABSTRACT

A membrane 30 and a method 12 for making the membrane 30 comprising the steps of selectively placing a first material 14 upon a substrate 16, depositing a certain material 26 upon a first material 14, and heating the materials 14, 16, 26, thereby forming a membrane 30.

12 Claims, 1 Drawing Sheet

MEMBRANE AND A METHOD FOR MAKING A MEMBRANE

FIELD OF THE INVENTION

The present invention generally relates to a membrane and to a method for making a membrane and more particularly, to a method which creates a wide variety of membranes in a cost effective manner, such as but not limited to a metal hydrogen permeable membrane.

BACKGROUND OF THE INVENTION

A membrane is used as a filter since it is adapted to allow only one or a few selected types of materials to pass through or traverse it. Particularly, a metallic membrane may be used in a wide variety of applications such as but not limited to a gasoline to hydrogen reformation process in which hydrogen is selectively removed from gasoline and used within a fuel cell.

While current metallic membranes do adequately provide desired filtering, they are relatively expensive requiring a relatively pure and relatively thick metallic layer in order to operatively obtain the desired filtering characteristics or attributes. Moreover, current metallic membrane creation processes are not readily adapted to efficiently and dynamically create different types of membranes having respectively diverse types of materials. Rather, these processes are usually adapted to utilize a certain type of metal and are not easily adaptable to allow the creation of diverse types of membranes having different types or selected types of metals or materials.

It is therefore desirable to provide a membrane and a process for creating a membrane which overcomes some or all of the previously delineated disadvantages of currently available membranes and processes.

SUMMARY OF THE INVENTION

It is a first non-limiting advantage of the present invention to provide a membrane which overcomes some or all of the previously delineated disadvantages of currently available membranes.

It is a second non-limiting advantage of the present invention to provide a process for creating a membrane. which overcomes some or all of the previously delineated disadvantages of currently used membrane creating processes.

According to a first aspect of the present invention, a membrane is provided. The membrane includes a first material; and a second material which is selectively deposited upon the first material.

According to a second aspect of the present invention a method for producing a membrane is provided. The method includes the steps of providing a substrate; rolling a first material onto the substrate; selectively depositing a second material onto the first material; and heating the first and second materials.

These and other features, aspects, and advantages of the present invention will become apparent from a reading of the following detailed description of the preferred embodiment of the invention and by reference to the following drawings.

DETAILED DESCRIPTION OF THE PREFERRED EMBODIMENT OF THE INVENTION

Figure 1A:
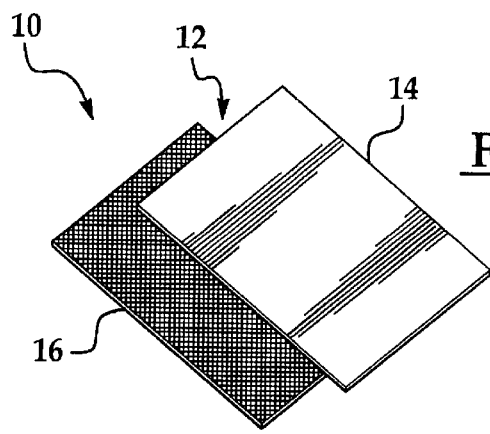
FIGS. 1(a–e) are diagrammatic illustrations of the steps comprising the methodology of the preferred embodiment of the invention.
Figure 1B:
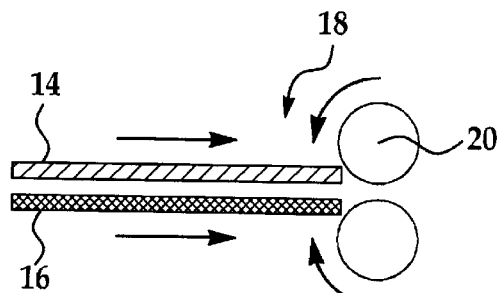
Figure 1C:
Figure 1C:
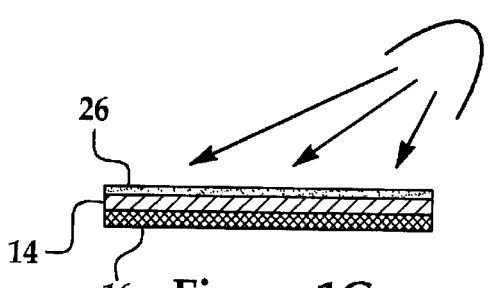
Figure 1D:
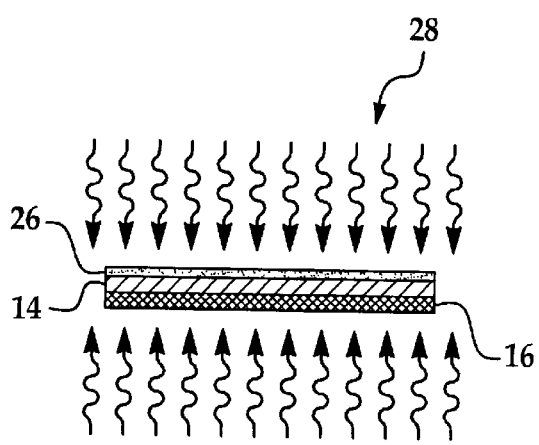
Figure 1E:
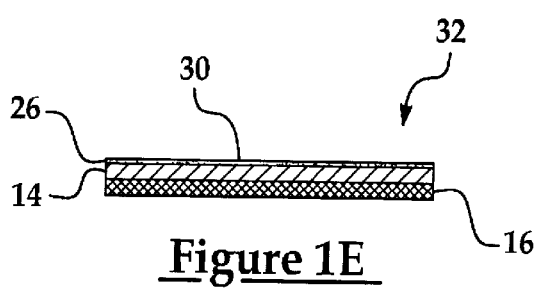

Referring now to FIGS. 1(a–e) there is shown a membrane creation methodology 10 of the preferred embodiment of the invention. As shown, methodology 10 begins with a first step 12 in which a first relatively inexpensive material 14, such as copper, is applied to a substrate material 16, such as Inconel® mesh.

Step 18 follows step 12 and, in this step 18, the first material 14 is compressed onto the substrate material 16 by a roller 20, thereby causing the first material 14 to be substantially integrated with and/or compressed into the substrate material 16. Step 22 follows step 18 and, in this step 22, a second material, 26 such as palladium, is selectively deposited upon the first material 14 by an evaporative or electrochemical deposition process. Other deposition processes may be used.

Step 28 follows step 22 in one embodiment and, in this step 28, the materials 14, 16, and 25 are heated at a predetermined temperature and for a predetermined time, effective to form membrane 30. For example, the materials 14, 16, and 26 are heated at a temperature of about 800 degrees Celsius for about one hour. Step 32 follows step 26 and in this step 32 the membrane 30 is removed from the furnace.

It should be realized that the foregoing rolling step 18 is accomplished before the deposition of palladium is accomplished, thereby substantially preventing structural degradation (e.g., the undesired separation of the mesh or material 16 from the membrane 30) caused by work hardening. Further, the processor methodology 10 allows for the selective and efficient deposition and use of a wide variety of materials, allows for the use of only a relatively thin layer of the relatively expensive material 26, thereby obviating the need for the formation of a relatively costly and relatively thick layer "pure" metal or "pure" palladium.

EXAMPLE

In order to fully appreciate the invention, the foregoing discussion describes an experiment which was conducted to verify the efficacy of the methodology of the invention and the produced membrane.

An Inconel® mesh was obtained and chosen since it resists interdiffusion from copper. Relatively inexpensive copper foil was then rolled onto the Inconel® mesh. By knowing the density of copper and palladium one can calculate the thickness required to produce a Pd40Cu alloy, using the following formula:

$$t_c/t_p = \rho Pd x F_c/[\rho Cu x (1-F_c)]$$

where:
  $t_c$=copper thickness
  $t_p$=palladium thickness
  $\rho Pd$=density of palladium (12.02 grams/cc)
  $\rho Cu$=density of copper (8.96 grams/cc)
  $F_c$=weight fraction of copper (40%)
  $t_c/t_p$=.894

Thus, for every 894 Å of copper 1000 Å of palladium was deposited upon the copper foil. Particularly, a total thickness of 2.11 microns of palladium was evaporated on the surface of a 3 micron copper foil. The sample was then heated at 800° C. for about one hour to produce a Pd40CU alloy.

Quantitative composition analysis was completed upon the created membrane using SEM energy dispersive spectroscopy. The analysis. confirmed and indicated the presence of a Pd40Cu metal alloy having the elemental composition of about 40.69% copper and about 59.31% palladium. Scanning electron microscope (SEM) photographs were then taken of the produced membrane and these photographs indicated a substantially "tight" pinhole free gain structure of the resultant membrane formed from a combination of copper and palladium.

It is to be understood that the invention is not limited to the exact construction or method which has been illustrated and discussed above, but that various changes and modifications may be made without departing from the spirit and the scope of the inventions as are more fully delineated in the following claims.

What is claimed is:

1. A method for making a membrane comprising the steps of depositing a first material comprising palladium onto a second material comprising copper; and heating the two materials at a temperature of about 800 degrees Celsius for about one hour.

2. The method of claim 1 wherein said first material is deposited on said second material by vapor deposition.

3. The method of claim 1 wherein said first material is deposited on said second material by electrochemical deposition.

4. The method of claim 3 wherein said first material forms a thin-layer on said second material.

5. A method for making a membrane comprising the steps of providing a substrate; rolling a first material comprising copper onto the substrate; depositing a second material comprising palladium onto the first material; and heating the first and second materials at a temperature of about 800 degrees Celsius for about one hour.

6. The method of claim 5 wherein said second material is deposited on said first material by vapor deposition.

7. The method of claim 5 wherein said second material is deposited on said first material by electrochemical deposition.

8. The method of claim 5 wherein said a thin layer of said second material is deposited on said first material.

9. A method for making a palladium and copper alloy membrane comprising the steps of:
   providing a mesh substrate;
   providing a roller assembly;
   providing a layer of copper;
   compressing the layer of copper onto the mesh substrate by passing the layer of copper and the mesh substrate through the roller assembly, thereby causing the layer of copper to be substantially integrated with the mesh substrate;
   depositing a layer of palladium upon the compressed copper and mesh substrate; and
   heating the deposited layer of palladium and the compressed copper and mesh substrate at about 800 degrees Celsius for about one hour, thereby creating the palladium and copper alloy membrane.

10. The method of claim 9 wherein the layer of copper has a first thickness and the layer of palladium has a second thickness, and wherein the step of depositing a layer of palladium upon the compressed copper and mesh substrate further comprises depositing the palladium in a manner to provide a ratio of the first thickness to the second thickness of about 0.894.

11. The method of claim 10 wherein the layer of palladium is deposited on the compressed copper and mesh substrate by vapor deposition.

12. The method of claim 10 wherein the layer of palladium is deposited on the compressed copper and mesh substrate by electrochemical deposition.

* * * * *